United States Patent [19]
Román

[11] Patent Number: 5,923,130
[45] Date of Patent: Jul. 13, 1999

[54] REPETITIVE AND CONSTANT ENERGY IMPULSE CURRENT GENERATOR

[76] Inventor: Francisco Román, Väktargatan 74A-111, 75422 Uppsala, Sweden

[21] Appl. No.: 08/742,131

[22] Filed: Oct. 31, 1996

[51] Int. Cl.[6] .................................................... H05T 1/20
[52] U.S. Cl. ........................... 315/363; 324/455; 361/231
[58] Field of Search .............................. 315/209 M, 363; 361/231, 232, 233; 324/455, 457

[56] References Cited

U.S. PATENT DOCUMENTS

| | | | |
|---|---|---|---|
| 1,697,177 | 1/1929 | Fortescue . | |
| 1,731,873 | 10/1929 | Smith . | |
| 2,140,395 | 12/1938 | Trencham et al. | 175/183 |
| 2,412,191 | 12/1946 | Zottu | 171/95 |
| 2,948,849 | 8/1960 | Foster | 324/54 |
| 4,935,657 | 6/1990 | Lherm et al. | 310/309 |
| 5,256,974 | 10/1993 | Padden | 324/458 |
| 5,293,113 | 3/1994 | Beha et al. | 324/72.5 |
| 5,300,889 | 4/1994 | Bakhoum | 324/457 |
| 5,587,868 | 12/1996 | Akutsu | 361/231 |

OTHER PUBLICATIONS

Feldman, P.L., AA. P.J. and Thanh, L.C., *Present Status of Research–Cottrell Pulse Energization Technology*, EPRI Conference on Electrostatic Precipitators Technology for Coal–Fired Power Plants, Nashville, Tennessee, Jul. 1982.
Francisco Román Campos, *The Influence of a Floating Electrode on the Breakdown Voltage of a Complex Gap*, Román, F.: UURIE 269–95 1, Institute of High Voltage Research, Uppsala University, 1995.
Francisco Román Campos, Vernon Cooray, and Viktor Scuka, *Corona From Floating Electrodes*, Journal of Electrostatics: Funamentals, Applications and Hazards, Institute of High Voltage Research, Uppsala University, Husbyborg, S–752 28 Uppsala, Sweden, Oct. 1995.
Francisco Román Campos, Erik Lötberg, Rolf Högberg, and Vikor Scuka, *Electrical Characteristics of Insulated Metallic Bodies in a Lightning Breakdown Field*, Institute of High Voltage Research, Uppsala University, Sweden, 22nd International Conference on Lightning Protection, 1994.
Francisco Román Campos, Vernon Cooray and Vikor Scuka, *The Corona Onset Voltage as a Function of the Radius of Curvature of Floating Electrodes*, The Eleventh International Conference on Gas Discharges and Their Applications, Chuo University, Tokyo, Sep. 11–15, 1995.
Francisco Romón Campos and Vikor Scuka, *The Influence of a Series Micro–Gap on the Breakdown Voltage Reduction of a Complex Gap Arrangement Containing Floating Electrodes*, FE, Ninth International Symposium of High Voltage Engineering, Aug. 28–Sep. 1, 1995, Graz Convention Center, Austria, Europe.

*Primary Examiner*—Don Wong
*Assistant Examiner*—David H. Vu
*Attorney, Agent, or Firm*—Jenkens & Gilchrist, P.C.

[57] ABSTRACT

This invention relates to an impulse generator which utilizes the properties of floating electrodes. An exemplary impulse generator comprises a floating electrode with a corona source, a series gap, an output terminal for connecting to a device undergoing electric impulse testing and a ground connection. The present invention generates an electric impulse signal for use in testing the impulse response or static electricity impulse response of an electronic circuit.

19 Claims, 3 Drawing Sheets

REPETITIVE AND CONSTANT ENERGY IMPULSE CURRENT GENERATOR

CROSS-REFERENCE TO RELATED APPLICATIONS

This application is related to the following copending U.S. patent applications:

| Ser. No. | Title | Inventor |
| --- | --- | --- |
| 08/715,332 filed 9/18/1996 | Electrostatic Field Measuring Device Based on Properties of Floating Electrodes | Francisco Román |
| 08/741,701 filed 10/31/1996 | Method and Apparatus for Increasing Corona | Francisco Román |
| 08/741,702 filed 10/31/1996 | Method and Apparatus for Obtaining Energy from an Electric Field | Francisco Román |

All of the copending applications are by the same inventor and are hereby incorporated herein in their entirety by this reference thereto.

BACKGROUND OF THE INVENTION

1. Field of the Invention

The present invention relates to the use of a floating electrode device wherein the floating electrode is charged by means of a corona source to a predetermined charge and then discharged across a series gap. The charging and discharging process is repeatable. The repetitious discharge is transformed into a repetitious voltage or current pulse and provided to a "circuit-under-test". The repetitious discharge can be used to test the circuit-under-test's ability to withstand multiple electric impulses.

2. Description of Related Art

Lightning discharges, voltage spikes, and other electrical impulses are one of the main causes of failure in electronic devices. Almost every lightning strike will be accompanied by subsequent strokes having time intervals of a few milliseconds or less. The initial electrical impulse and subsequent impulses can affect an electronic circuit and its componentry in a variety of ways. The impulse can disturb or change the characteristics of a device's protection circuitry. After several impulse strikes the protection circuitry may become stressed and change its electrical characteristics enough to allow a small part of the electrical impulse into other circuitry which the protection circuitry is supposed to protect. As a result, the circuitry can malfunction or be damaged.

In the market place today, it has become more and more important to test electronic circuitry and to determine how well circuitry will hold up to repetitive electrical impulses. One of the main problems with prior art electronic impulse test equipment is its inability to produce repetitive discharges having a time difference of a few milliseconds or less and its inability to produce an electrical impulse having wave front's with a rise time of a few nanoseconds while maintaining a constant current waveform.

Presently, most voltage and current impulse generators are based on a circuit design called a Marx generator. One limitation of Marx generators is the series inductance of its components. The series inductance increases the rise time of the generated impulses. Furthermore, the Marx generator is not capable of producing several impulses per second.

Thus, it would be advantageous to provide an impulse generator capable of producing electrical impulses having a rise time of a few nanoseconds which have substantially a constant current waveform. Furthermore, it would be advantageous to provide a repetitive constant energy impulse generator that can repeat pulses every few microseconds without changing its waveform.

SUMMARY OF THE INVENTION

The present invention relates to an apparatus and method for producing electrical impulses having a rise time of a few nanoseconds. Furthermore, the present invention relates to an apparatus and method for producing electrical impulses having a repetition rate of a few microseconds.

The present invention incorporates a floating electrode located in an electric field. The floating electrode has characteristics that produce corona currents and thereby produce a electrical charge which discharges across a gap. The corona currents can be utilized to produce repetitious discharges or current impulses.

BRIEF DESCRIPTION OF THE DRAWINGS

These and other objects and advantages of this invention will become a parent and more readily appreciated from the following description taken in conjunction with the accompanying drawings, of which.

DETAILED DESCRIPTION OF THE EXEMPLARY EMBODIMENTS OF THE PRESENT INVENTION

Figure 1:
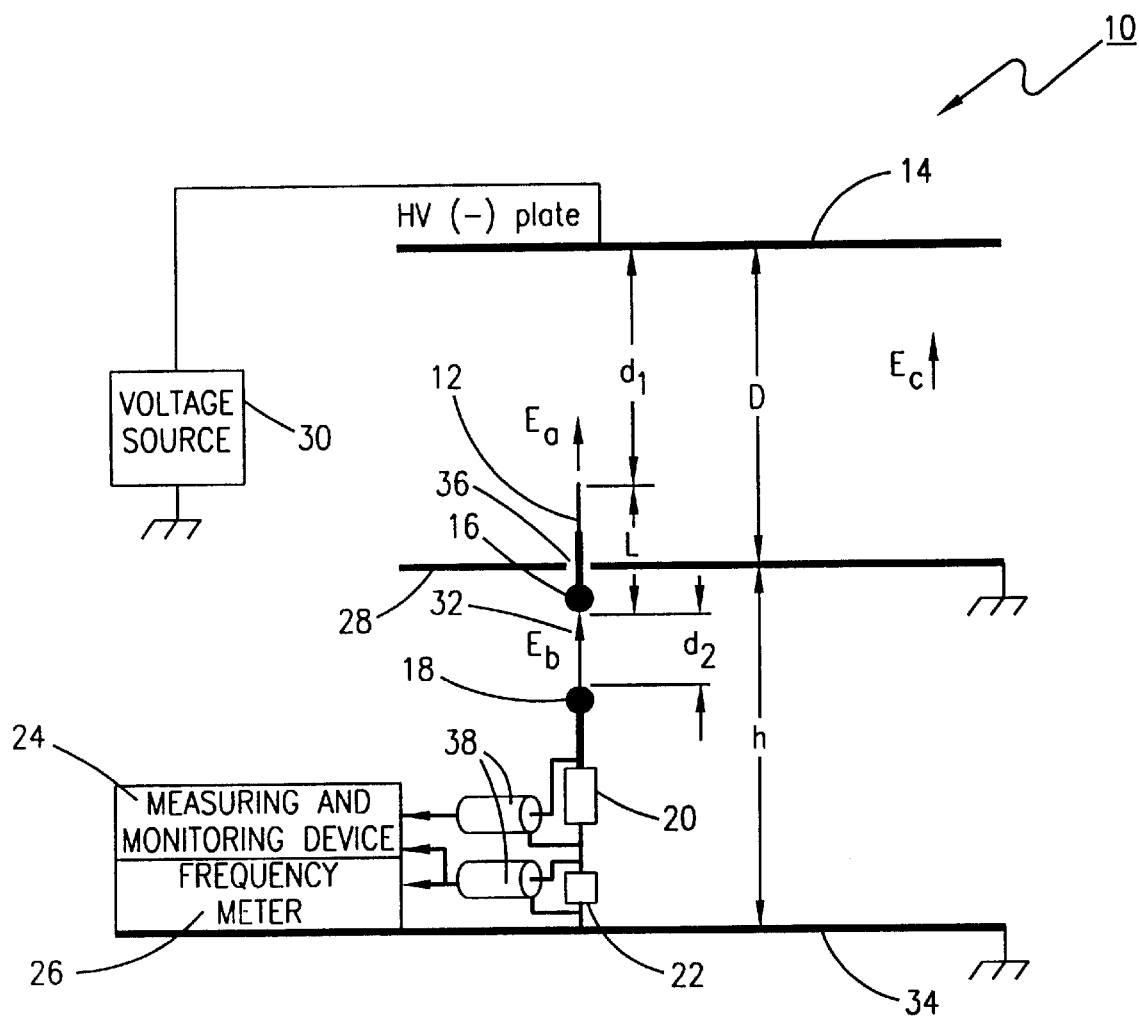
FIG. 1 depicts an exemplary current impulse generator in accordance with the present invention.

FIG. 1 depicts an exemplary embodiment of the present repetitive impulse current generator 10. The metallic plates 14 and 28 are placed to form a plate-to-plate arrangement. The plate 28 is earthed and has a hole 36. Another metallic plate 34 is placed parallel to the plate 28 at a distance h. The DC voltage source 30 provides the voltage that is applied to the potential plate 14. It is understood that the voltage source 30 could also be an AC, impulse or a positive/negative DC source. A floating electrode 12 of length L is placed at a certain distance $d_1$ from the potential plate 14. The floating electrode passes through the hole 36 drilled in the earthed plate 28. The floating electrode 12 is electrically connected to a first sphere 16. The first sphere is displaced from a second sphere 18 thereby establishing a secondary gap 32 of distance $d_2$. The distance between the plates 14 and 28 is D. The voltage applied to the plate 14 divided by the distance D is the reference electric field $E_c$.

When a voltage is applied to the plate 14, electric fields $E_a$ and $E_b$ are established at the top of the floating electrode 12 and at the series gap 32, respectively. When the reference electric field $E_c$ increases, the electric field $E_a$ at the tip of the floating electrode 12 becomes equal to the corona onset electric field and corona starts there. The corona currents charge the floating electrode 12 which increases the potential difference between the sphere 16 and the earthed sphere 18. When the electric field in the series gap 32 becomes equal to the gap 32 breakdown electric field, a discharge bridges the gap 32 and corona currents begin to charge the floating electrode 12 again. The discharge process repeats several times. The current impulses are respectively produced such that the time differences between pulses can be in the order of 100 milliseconds or less. The discharge repetition frequency is the inverse value of the time difference between impulses. The discharge repetition frequency depends on the radius of curvature of the floating electrode 12 and the sphere 16, the reference electric field $E_c$, the amplitude and polarity of the applied DC voltage at the plate 14, and the secondary gap distance 32. However, the discharge repetition frequency is mainly controlled by varying the applied voltage to the potential plate 14.

The object undergoing test 20 is connected in series with the current being discharged to ground from the second sphere 18. The current impulse passes through the object undergoing test 20. The voltage across the object undergoing test is transferred by means of a conventional coaxial cable 38 to the oscilloscope or transient recorder 24.

A measuring probe 22, such as a Rogowsky coil or a coaxial resistor is connected in series with the object undergoing test 20. Preferably the measuring probe 22 should have a response time of less than two nanoseconds. Measuring and monitoring devices 24 are connected by means of a conventional coaxial cable 38 to the measuring probe 22. The measuring device can include an oscilloscope or transient recorder 24 and a frequency meter 26.

Figure 2:
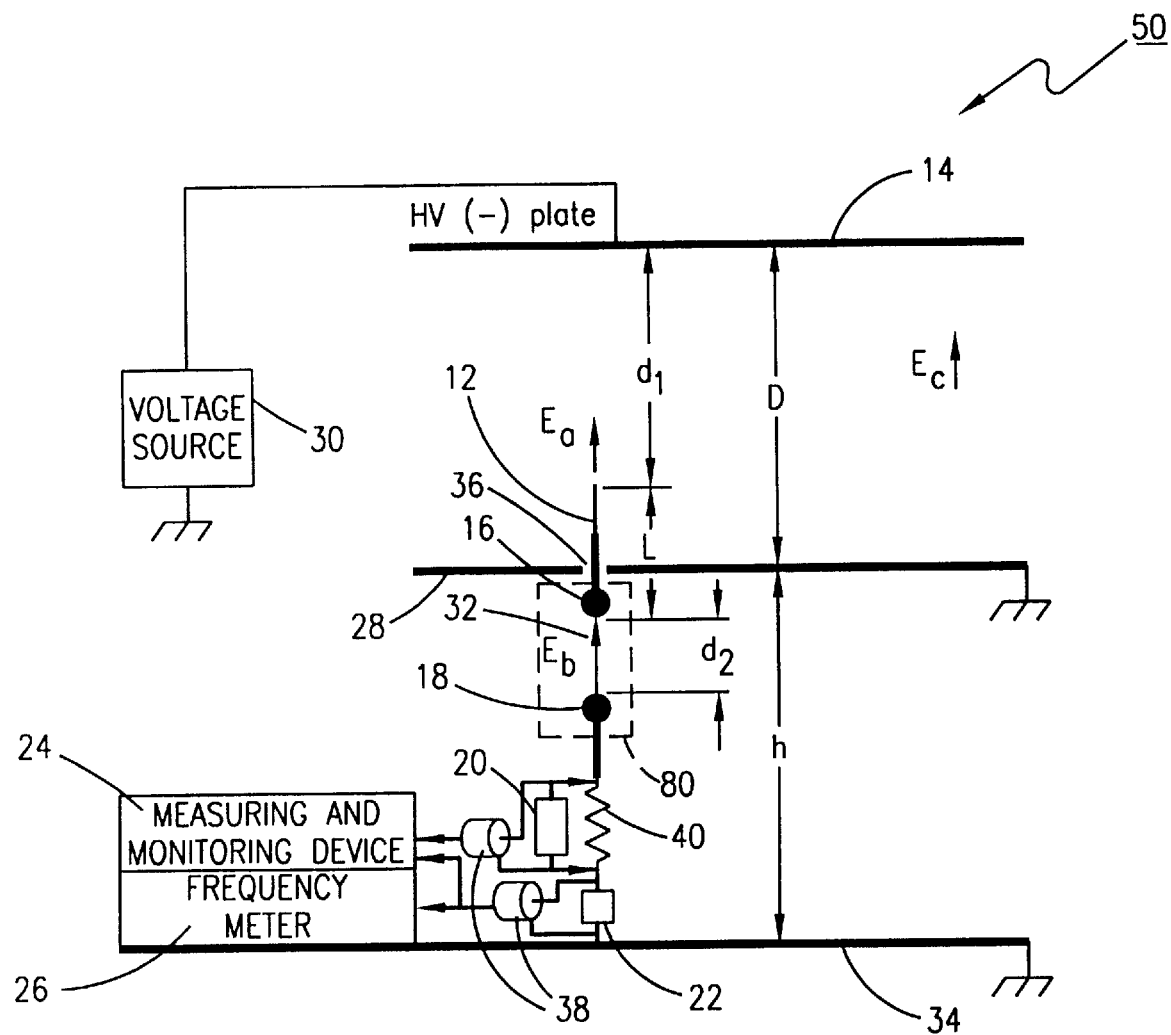
FIG. 2 depicts an exemplary voltage impulse generator
Figure 3:
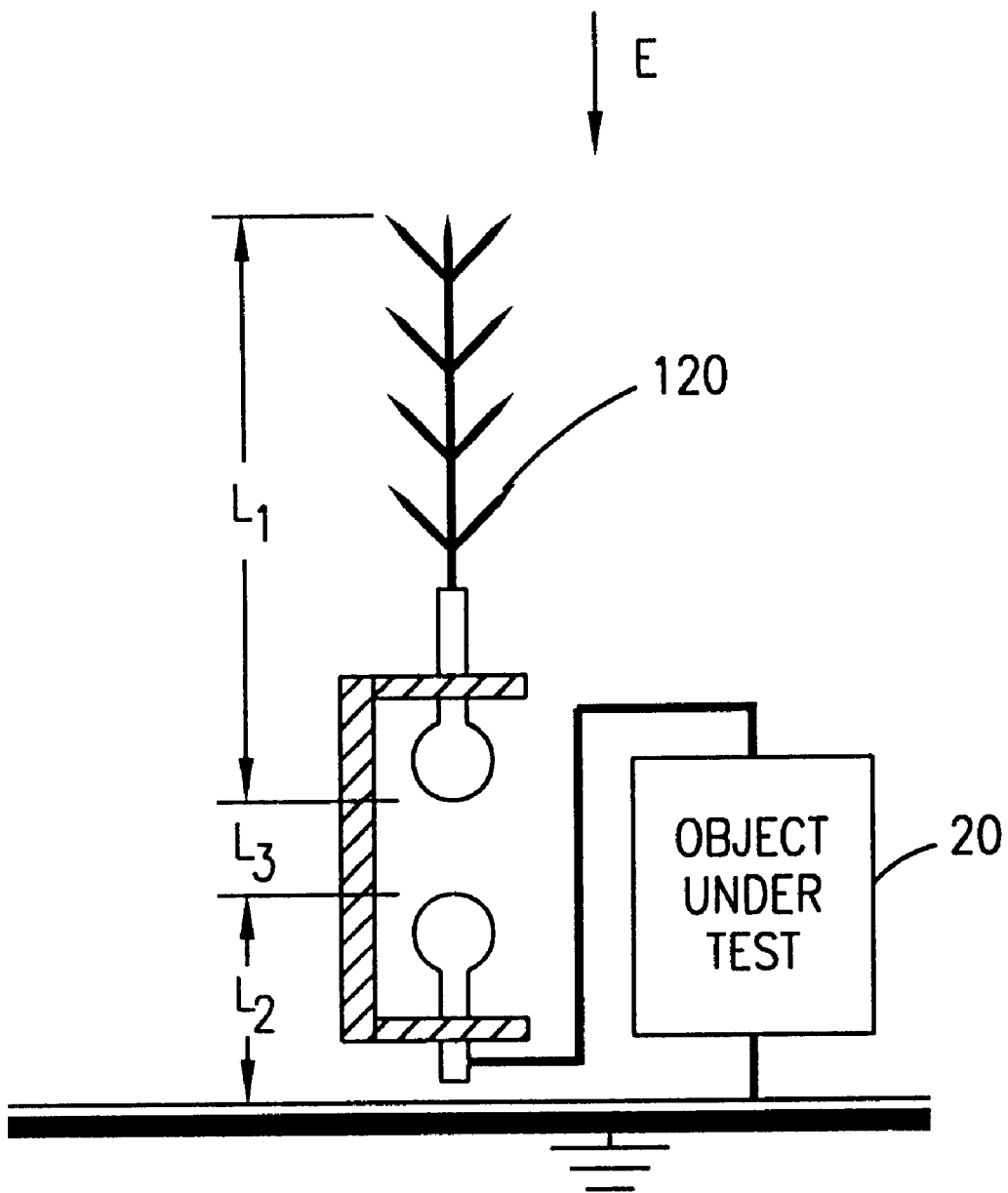
FIG. 3 depicts an exemplary floating electrode 120 which comprises a plurality of pointed or wire-like extensions from the electrode's base.

FIG. 2 depicts a second embodiment of the present repetitive impulse generator acting as an impulse voltage generator 50. The main difference between the current impulse generator in FIG. 1 and the impulse voltage generator in FIG. 2 is the resistor 40. The current impulse generated by the discharge of the gap 32 is applied to the resistor 40 connected in series with the earth connection of the second sphere 18. The voltage drop across the resistor 40 is applied in parallel to the object undergoing test 20. A typical value for the resistor 40 is 50 ohms. An output voltage from the object undergoing test 20 is measured in parallel with the object undergoing test 20. A conventional coaxial cable 38 can bring the voltage signal to transient recorder or a fast oscilloscope 24, so that the repetitive impulses can be monitored. The current is measured with the measuring probe 22. The measuring probe 22 should have a response time of less than two nanoseconds. Measuring and monitoring devices 24 are also connected by means of a conventional coaxial cable 38 to the measuring probe 22. The measuring device can include a frequency meter 26.

It is understood that the floating electrode 12 can have various configurations. Such floating electrode configurations include having a plurality of sharp points.

The two spheres and the series gap 32 can be contained in an enclosure 80. The enclosure can be filled with an insulating fluid or a gas at a predetermined pressure. The gas or fluid is used to control and/or change the breakdown characteristics of the discharge across the series gap 32.

Certain parameters of the present repetitive, constant energy impulse generator can be changed to provide variations in the generator's output. For example, the rise time of the impulses can be changed by changing the size of the series gap 32. If the series gap distance $d_2$ increases, the rise time of the current impulses increases and vice versa.

The amplitude of the voltage or current impulses generated by the present invention depends on the capacitance of the floating electrode. This capacitance can be changed by varying the dimensions of the floating electrode or the capacitance to the earthed plate 28.

The impulse repetition frequency can be changed by varying the background electric field generated between the potential plate 14 and the grounded plate 28. The impulse repetition frequency can also be modified by changing the shape or number of tips (points) associated with the corona source at the tip of the floating electrode 12. If the radius of curvature of the tip of the floating electrode is decreased, the impulse repetition frequency will increase for the same background electric field.

As is clearly seen, the present invention is significant in the art of impulse generation and the testing of a device's response to electrical impulses. The present invention is believed to be especially effective when configured and employed as described herein, however, those skilled in the art will readily recognize that numerous variations and substitutions may be made in the invention and its use and configuration to achieve substantially the same results as achieved by the embodiments and, in particular, the preferred embodiment described herein. Each variation is intended to be included in the description herein and forms a part of the present invention. The foregoing detailed description is, thus, to be clearly understood as being given by way of illustration and example only, the spirit and scope of the present invention being limited solely by the appended claims.

What is claimed is:

1. An impulse generator comprising:

a floating electrode;

a source adapted to provide a predetermined charge located a predetermined distance from said floating electrode;

a first conductive portion connected to said floating electrode;

a second conductive portion positioned a predetermined distance from said first conductive portion, said second conductive portion connected to an object undergoing test which is to receive an electrical impulse.

2. The impulse generator of claim 1, wherein said first conductive portion and said second conductive portion are sphere-like.

3. The impulse generator of claim 1, wherein said first conductive portion and said second conductive portion are contained in an enclosure.

4. The impulse generator of claim 3, wherein said enclosure contains at least one of a gas and a liquid.

5. The impulse generator of claim 1, further comprising a monitoring device, electrically connected to said second conductive portion.

6. The impulse generator of claim 1, wherein said impulse generator further comprises means for creating a current impulse.

7. The impulse generator of claim 1, wherein said impulse generator further comprises means for creating a voltage.

8. The impulse generator of claim 1, wherein said floating electrode comprises at least one corona source.

9. The impulse generator of claim 8, wherein said at least one corona source is at least one of a single needle and a needle having a plurality of sharp points extending therefrom.

10. The impulse generator of claim 1, wherein said source is a conductive plate.

11. The impulse generator of claim 1, wherein said source is connected to at least one of a DC, an AC, and an impulse power source.

12. A method of generating repetitive electrical impulses comprising the steps of:

providing a high voltage to a conductive plate;

placing a floating electrode a first predetermined distance from said conductive plate, said floating electrode comprising a corona source and a first conductive portion;

placing a second conductive portion a second predetermined distance from said first conductive portion;

allowing an electrical discharge to travel from said first conductive portion, across said second predetermined distance, to said second conductive portion; and providing an output from said second conductive portion to an object undergoing test.

13. The method of generating repetitive electrical impulses of claim 12, wherein said electrical impulses are current impulses.

14. The method of generating repetitive electrical impulses of claim 12, wherein said electrical impulses are voltage impulses.

15. The method of generating repetitive electrical impulses of claim 12, further comprising the step of monitoring said output.

16. The method of generating repetitive electrical impulses of claim 12, wherein said first conductive portion and said second conductive portion are sphere-like.

17. The method of generating repetitive electrical impulses of claim 12, wherein said step of providing a high voltage to a conductive plate comprises providing one of a positive DC voltage and a negative DC voltage.

18. The method of generating repetitive electrical impulses of claim 12, wherein said step of providing a high voltage to a conductive plate comprises providing an AC voltage.

19. The method of generating repetitive electrical impulses of claim 12, wherein said step of providing a high voltage to a conductive plate comprises providing one of a positive impulse voltage and a negative impulse voltage.

* * * * *